United States Patent [19]

Kobayashi

[11] Patent Number: 4,674,100
[45] Date of Patent: Jun. 16, 1987

[54] BISTABLE OPTICAL DEVICE

[75] Inventor: Kohroh Kobayashi, Tokyo, Japan

[73] Assignee: NEC Corporation, Tokyo, Japan

[21] Appl. No.: 658,008

[22] Filed: Oct. 5, 1984

[30] Foreign Application Priority Data

Oct. 6, 1983 [JP] Japan .................. 58-187314

[51] Int. Cl.[4] ............................................. H01S 3/19
[52] U.S. Cl. ......................................... 372/96; 372/8; 372/50
[58] Field of Search .................... 372/96, 50, 8, 19, 29

[56] References Cited

U.S. PATENT DOCUMENTS 4,338,577  7/1982  Sato et al. ............................. 372/29

FOREIGN PATENT DOCUMENTS 0048490  3/1983  Japan .................... 372/50
0075877  5/1983  Japan .................... 372/50
0138087  8/1983  Japan .................... 372/96
0048975  3/1984  Japan .................... 372/50
0092592  5/1984  Japan .................... 372/50

OTHER PUBLICATIONS

Ogawa et al., "Bistable Optical Device Using a Light Emitting Diode", Applied Optics, vol. 21, No. 11, Jun. 1, 1982, pp. 1878–1880.

Primary Examiner—James W. Davie
Attorney, Agent, or Firm—Sughrue, Mion, Zinn, Macpeak & Seas

[57] ABSTRACT

An optical bistable device comprising a semiconductor laser including a diffraction grating which diffracts light parallel to the grating for laser resonance and additionally diffracts a higher order Bragg beam perpendicular to the grating. An optical detector receives the higher order beam and produces an electrical signal which is used as a partial exciting current for the semiconductor laser. Thereby, the two optical ports of the laser can be used for other purposes.

5 Claims, 6 Drawing Figures

BISTABLE OPTICAL DEVICE

BACKGROUND OF THE INVENTION

The present invention relates to an optical logic function device, and more particularly to a bistable optical device having two stable output levels for the same input level.

Bistable optical devices, have atracted sharp interest as the main constituent elements for optical logic circuits and optical memory circuits in the future, and have now become objects of intensive research and developmental efforts. In the prior art, bistable optical devices have been realized by combining light emitting elements and light receiving elements, converting the output light from the light emitting element into electric signals and returning the electric signal to the light emitting element. It is generally necessary in a bistable optical device to inject the input light for the purpose of triggering as well as extracting the output light. In other words, there are required two optical circuits for inputting and outputting light. In the previously bistable optical device, in which one light output is used for feedback, there are needed altogether three optical circuits for inputting and outputting light.

In a conventional semiconductor laser, however, only two optical circuits are available because the two output reflectors of its resonator are used for input and output. Therefore, in order to realize a bistable optical device of the above-mentioned kind, additional circuits including a light branching element are needed besides a light emitting element and a light receiving element, resulting in not only a reduced stability but also a greater overall size of the bistable optical device, thereby making it difficult to integrate many such devices.

SUMMARY OF THE INVENTION

An object of the present invention is to provide a compact, stable and readily integratable bistable optical device by the use of a semiconductor laser.

According to the invention, there is provided a bistable optical device comprising a semiconductor laser having a built-in higher-order Bragg diffraction grating, a photodetector for receiving the light diffracted thereby, and means for feeding back the electric output of the photodetector to the semiconductor laser.

The present invention, utilizing the emission of light diffracted by a higher-order Bragg diffraction grating in the direction different from that of the usual laser beam output, makes it possible to realize a compact, stable and readily integratable bistable optical device without having to use any other element, such as a light branching element. A higher-order Bragg diffraction grating in this context is a diffraction grating whose pitch $\Lambda$ can be represented by the equation $\Lambda = m \cdot \lambda_0 / 2$ ($m = 2, 3, \ldots$) where $\lambda_0$ is the so-called guide wavelength in the crystal. Usually a second-order diffraction grating of $m = 2$ is used, and in this case the light is diffracted in two directions, one parallel to and the other normal to the diffraction grating. According to the present invention, of the two light beams diffracted in the two directions, the beam normal to the diffraction grating is used as the input light to the photodetector.

DETAILED DESCRIPTION OF THE PREFERRED EMBODIMENTS

Figure 1:
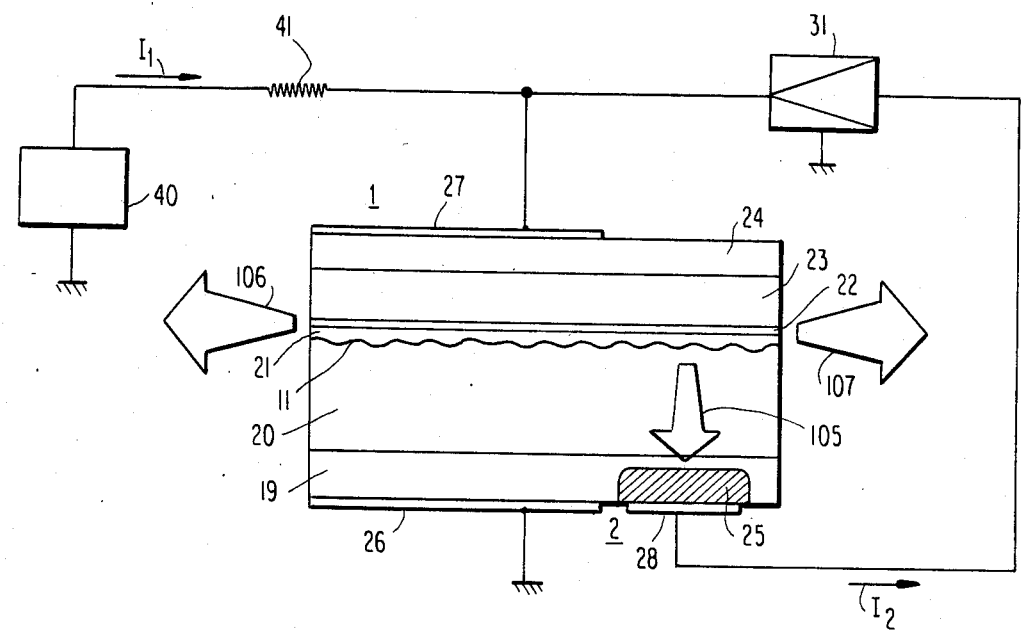
FIG. 1 shows a partial section of a bistable optical device, which is a first preferred embodiment of the present invention.

FIG. 1 shows a section of a first preferred embodiment of a laser 1 and a photo detector 2 of the present invention. Over an n-InP substrate 20 on its (001) plane is formed a second-order diffraction grating 11 of 3960 Å in pitch by the usual processes of interfering exposure to He-Cd laser beam and chemical etching, and further over it are formed an n-InGaAsP optical waveguide layer 21 (0.2 micron thick, 1.15 microns in composition wavelength), a non-doped InGaAsP active layer 22 (0.1 micron thick, 1.3 microns in composition wavelength), a p-InP cladding layer 23 (1 micron thick) and a p-InGaAsP cap layer 24 (0.8 micron thick, 1.2 microns in composition wavelength) formed by epitaxial growth. After grinding the substrate 20 to an overall thickness of about 130 microns, an n-InGaAsp photodiode active layer 19 (1.5 microns thick, 1.5 microns in composition wavelength) is epitaxially grown on the substrate side and, masked with $SiO_2$, Zn is selectively diffused within the substrate 20 to form a p region 25. Then, AuGeNi is evaporated and alloyed on the surface of the substrate 20 and that of the p-diffused region 25 to form a negative electrode 26 and a photodiode electrode 28, respectively. Over the surface the cap layer 24, except its part opposite to the p-diffused region 25, is formed a positive electrode 27 by evaporating and alloying AuZn. The structure is cut into a chip by cleaving, and thereby is completed the production of a bistable optical device. Current is supplied in the forward direction between the positive electrode 27 and the negative electrode 26, which is grounded, from a D.C. power source 40 through a 100Ω resistor 41 as a result laser oscillation is generated in the diffraction grating 11 by a feedback in a direction parallel to the face of the diffraction grating 11. The pitch of the diffraction grating 11 is substantially equal to the 1.3 micron guide oscillation wavelength because the effective refractive index determined by the thickness and the refractive index of the crystal layers is about 3.28. Thus, this is a second-order diffraction grating having a pitch twice as long as the half wave of this oscillation wavelength. Therefore, the second-order diffracted light travels in a direction reverse to the incident light and a first-order diffracted light 105 is scattered in a direction normal to the incident light. Then, if a pn junction formed by the p region 25 receives this scattered light, the junction converts the light into a photocurrent, amplifies it with an amplifier 31 and returns it to the positive electrode 27. The result will be equivalent to partial detection and feedback of the laser beam output.

Figure 2:
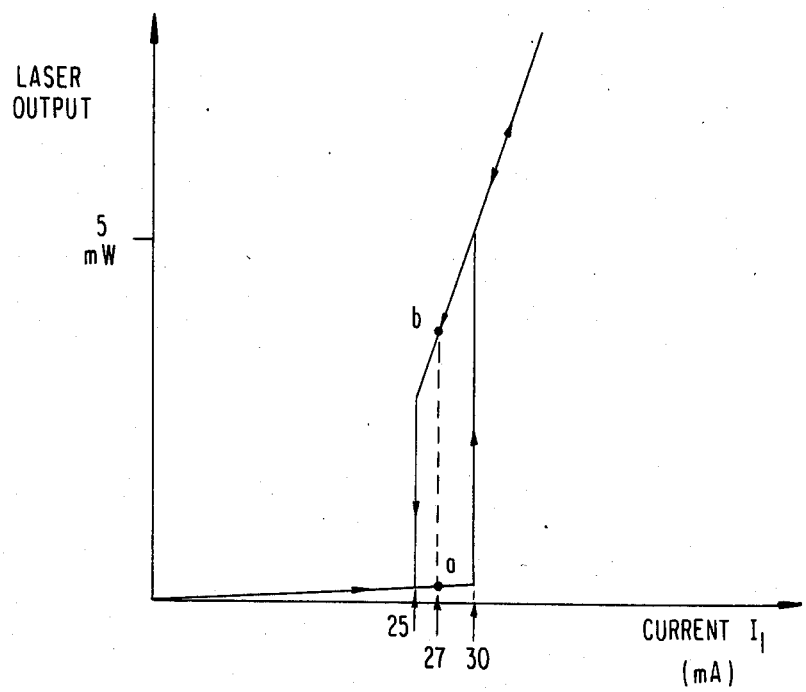
FIG. 2 is a chart for facilitating description of the operation of the embodiment.

This operation will be further described below with reference to FIG. 2, which illustrates the relationship between a current I1 supplied from the power source 40 to the semiconductor laser 1 and the amplitude of a laser beam output 106. As a photocurrent I2 flows in response to the first-order diffracted light 105, it is amplified by the amplifier 31 and injected into the semiconductor laser 1 through the positive electrode 27. This current combines with the current I1 from the power source 40, and works in such a direction as will further excite the semiconductor laser 1. Therefore, this is a positive feedback. In this particular embodiment, as the amplitude of the current I1 approaches 30 mA, this positive feedback becomes significant, resulting in rapidly amplified laser oscillation. This rapidly amplified laser oscillation also results in an increased intensity of the first-order diffracted light 105, accompanied by an increase in the amplitude of the photocurrent I2, but it is saturated at a certain level according to the saturation characteristic of the photodetector 2, so that the amplitude of the laser beam output 106, too, is saturated at that point of time. Even if the current I1 is further increased, the contribution of the photocurrent I2 will not significantly increase, and the amplitude of the laser beam output 106 will only slowly increase with the rise of the current I1. Next will be considered a contrary case in which the current I1 is lowered from a level above 30 mA. Even if the current I1 goes down below 30 mA, laser oscillation will not stop because there still will be the contribution of the photocurrent I2, and the laser beam output will only gradually decrease with the fall of the current I1. If the current I1 is further reduced, the aforementioned positive feedback will work in the reverse direction, and the laser oscillation will suddenly stop. This embodiment is so designed as to stop its laser oscillation when the current I1 falls below 25 mA. As is evident from the foregoing description, this embodiment manifests the so-called hysteresis, effect the current level of a rising current I1 at which the laser oscillation starts differing from that of a falling current I1 at which the laser oscillation stops. Therefore, if the current amplitude is set between these two oscillation thresholds, for instance 27 mA, two stable operating points corresponding to points a and b in FIG. 2 can be obtained, resulting in bistable performance.

Since neither ordinary laser beam output 106 nor 107 is utilized for generating bistabilization in this embodiment, both of them can be used as light outputs. Further, considering the reversibility of light, the ports where the outputs 106 and 107 are emitted can be used as light input circuits for the triggering purpose. Thus, with this embodiment is realized a bistable optical device without using any additional passive circuit, such as a light branching circuit. Devices of this kind are compact, stable and readily integratable.

Figure 3:
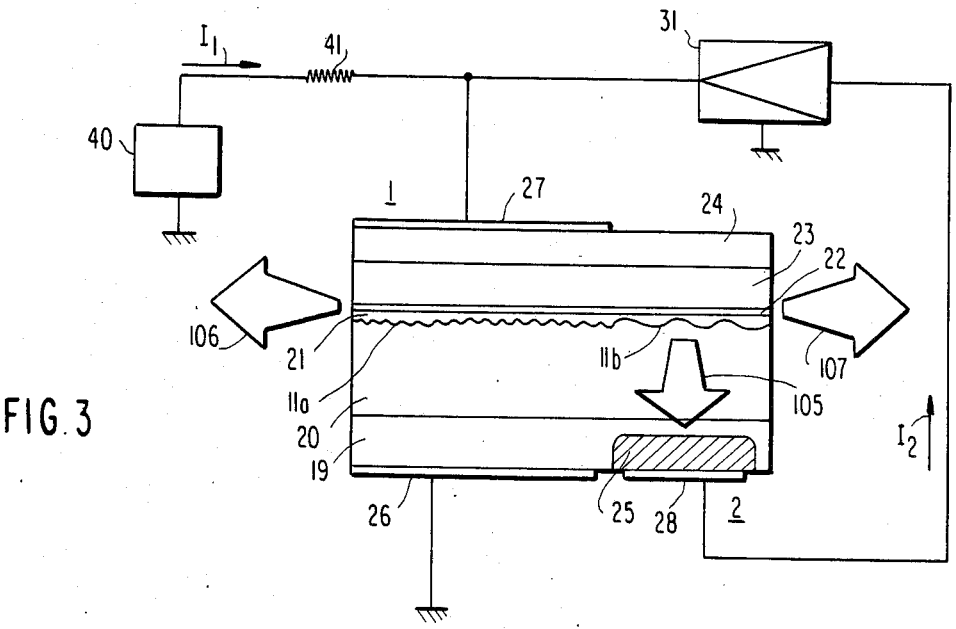
FIG. 3 shows a partial section of a second preferred embodiment of the invention.

FIG. 3 gives a sectional view of a second preferred embodiment of the present invention. This embodiment differs from the first in that two diffraction gratings are formed therein, a first diffraction grating 11a with a 1980 Å pitch for laser oscillation and a second diffraction grating 11b of 3960 Å in pitch for extracting the diffracted light. The pitch of the first diffraction grating 11a is half the guide oscillation wavelength in the crystal. Thus this is a first-order diffraction grating. As, therefore, the diffracted light is only in a direction toward the inside of the active layer 22, there is expected a more efficient laser performance with lower thresholds than the semiconductor laser of the first embodiment. On the other hand, the second diffraction grating 11b, which is a second-order diffraction grating as stated above, gives the diffracted light 105 in a direction normal to the face of the active layer 22, and bistable performance can be realized with this diffracted light 105 being used for the purpose of feedback.

Figure 4:
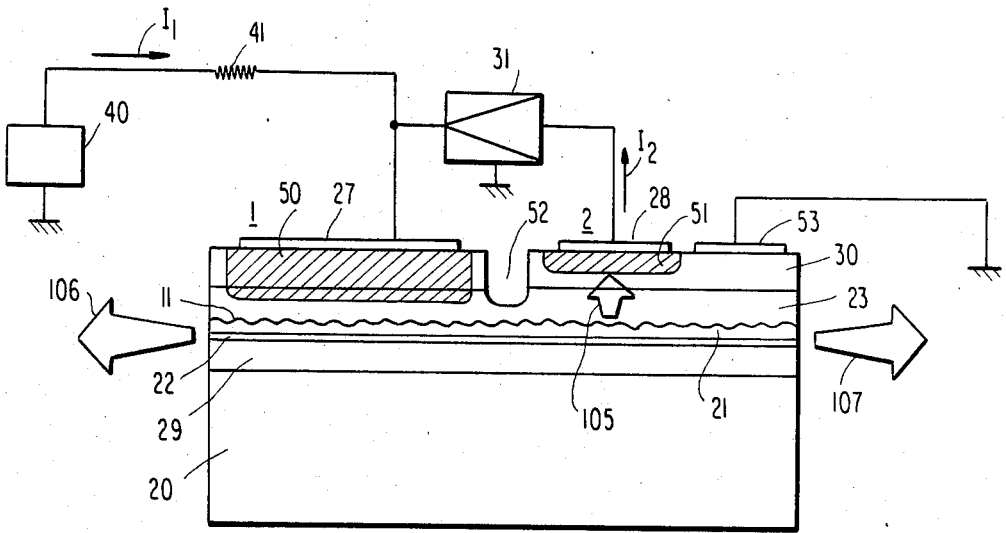
FIGS. 4 and 5 relate to a third preferred embodiment of the invention, FIG. 4 showing the bistable optical device including a lengthwise section of an integrated structure of a laser diode and a photodiode, and FIG. 5, a cross section of the integrated laser diode-photodiode structure.

FIG. 4 shows a section of a third preferred embodiment of the invention. Over a semi-insulated InP substrate 20 are formed by liquid-phase growth an n-InP buffer layer 29, a non-doped InGaAsP active layer 22 (0.1 micron thick, 1.55 microns in composition wavelength) and a p-InGaAsP optical waveguide layer 21 (0.2 micron thick, 1.3 microns in composition wavelength), further over them is formed a second-order diffraction grating 11 of 4600 Å in pitch, and still further over it are formed, again by liquid-phase growth, a p-InP cladding layer 23 and a n-GaAsP cap layer 30 (1 micron thick, 1.6 microns in composition wavelength). After that, by selective diffusion of Zn, a laser electrode region 50 and a photodiode region 51 are formed deep enough to have the electrode region 50 penetrate the cap layer 30 and to confine the photodiode region 51 within the cap layer 30. A groove 52 is formed to separate the two regions 50 and 51 to a great enough depth to reach the cladding layer 23. Then, a positive laser electrode 27 and a positive photodiode electrode 28 are formed in the same manner as in the first embodiment.

Figure 5:
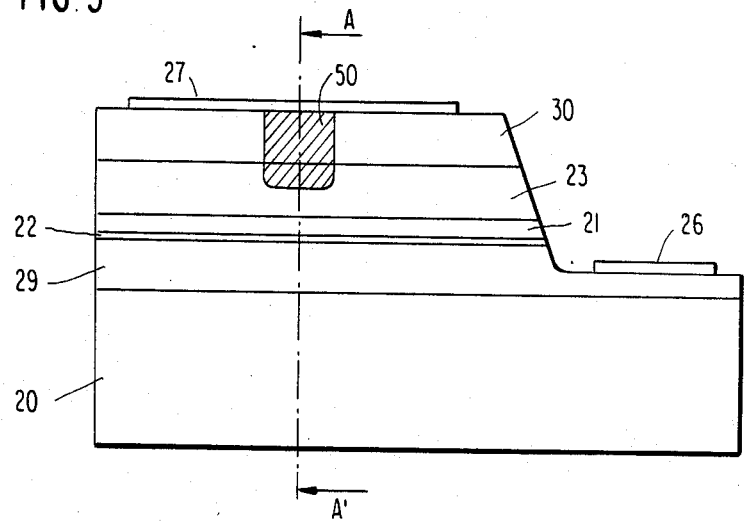

Referring to FIG. 5 in combination, at least one side is removed by etching until the buffer layer 29 is reached, and there are formed a negative laser electrode 26. Also, formed is a negative photodiode electrode 53 on the n-InGaAsP cap layer close to the positive photodiode electrode 28.

With this embodiment, too, bistable optical operation has been achieved by feeding back an output current I2 of a photodiode 2 through an amplifier 31 to a semiconductor laser 1. It is exactly the same as the foregoing embodiments in that the optical outputs of the laser 1 in two directions can be used for input/output optical circuits. Further, devices of this kind can be integrated in a large number, for instance in the form of an array.

Figure 6:
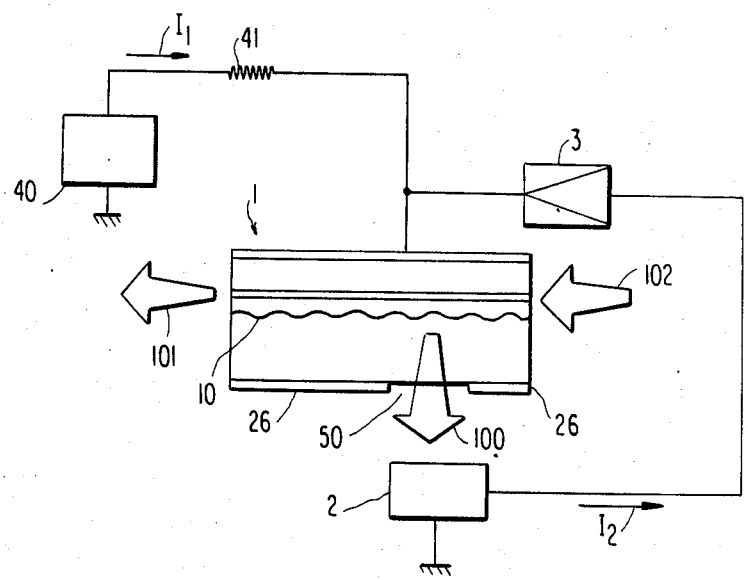
FIG. 6 illustrates the bistable optical device, which is the third preferred embodiment of the invention.

FIG. 6 is a block diagram of a fourth preferred embodiment of the present invention. Although all of the above described three embodiments, the first through third, have their respective photodetectors 2 and semiconductor lasers 1 monolithically integrated in the same crystal chip, the photodetector 2 need not be integrated with the semiconductor laser 1 because the essence of the present invention consists in the use of higher-order diffracted light as input to the photodetector. In this embodiment, an independent photodetector 2 is arranged outside a semiconductor laser having a second-order diffraction grating 10. In order that a diffracted light 100 can be taken out to the exterior, of the chip a part of a negative electrode 26 is removed to form a port 50. This port may as well be formed in a positive electrode 27, with the photodetector 2 arranged close to it. This structure having the photodetector arranged outside can also give a bistable optical device as do the previous foregoing embodiments.

The present invention can be embodied in a number of versions other than the basic ones so far described. First as regards laser structure, there can be used various horizontal mode control structures known up to date, for instance a double channel planar buried heterostructure. With respect to feedback means, if the output current of the photodiode is great enough, there will be no need for an amplifier circuit, but bistable operation can be achieved merely by connection with wires. Further, besides externally arranged electric circuits, transistors and FETs may be formed on the substrate with satisfactory effects. In this case, it would be easier to form them on a semi-insulating substrate. The photodetector may either be integrated in a monolithic structure or externally arranged in a proximate position. Though the foregoing description of the preferred embodiments primarily referred to the DFB (distributed feed back) type, the same principles can be applied to the DBR (distributed Brogg reflects) type as well.

What is claimed is:

1. A bistable optical device comprising a semiconductor laser having first and second output ports at end facets thereof and a built-in Bragg diffraction grating of second order or higher for providing a third output port, a photodector positioned to receive light diffracted normal to said grating to thereby produce an electric output in response to said light diffracted normal to said grating, and means for feeding back the electric output of the photodetector to the semiconductor laser, said device thereby having bistable states depending upon the excitation of said laser.

2. A bistable optical device comprising: a semiconductor laser diode including an active layer emitting light in response to an exciting current, a diffraction grating of a prescribed pitch for diffracting a first portion of the light emitted by said active layer in a direction parallel to said active layer to first and second outputs and a second portion normal to said active layer to provide a third output, said semiconductor laser diode generating a laser beam by positive optical feedback effected by the light diffracted by said diffraction grating;

a current source for supplying the exciting current to said semiconductor laser diode;

photoelectric converter means having a nonlinear characteristic for receiving a laser light diffracted by said diffraction grating in a direction normal to the direction of said active layer and converting received light into electric signals;

means for electrically feeding back to said semiconductor laser diode the output electric signals of said photoelectric converter means, said exciting current comprising said fed back signals.

3. A bistable optical device, as claimed in claim 2, wherein said diffraction grating is a second-order Bragg diffraction grating.

4. A bistable optical device, as claimed in claim 2, wherein said diffraction grating is composed of first-order and second-order Bragg diffraction gratings, and said photoelectric converter means is arranged in a direction normal to the grating face of said second-order Bragg diffraction grating.

5. A bistable optical device as claimed in claim 2, wherein said photoelectric converter means are integrated with said semiconductor laser diode.

* * * * *

UNITED STATES PATENT AND TRADEMARK OFFICE
CERTIFICATE OF CORRECTION

PATENT NO. : 4,674,100
DATED : June 16, 1987
INVENTOR(S) : Kohroh Kobayashi

It is certified that error appears in the above-identified patent and that said Letters Patent is hereby corrected as shown below:

| | |
|---|---|
| COLUMN 2, LINE 52 | After "result" insert --,-- |
| COLUMN 3, LINE 40 | After "hysteresis" delete "," |
| COLUMN 3, LINE 40 | After "effect" insert --,-- |
| COLUMN 4, LINE 56 | After "exterior" delete "," |
| COLUMN 4, LINE 56 | After "chip" insert --,-- |
| COLUMN 4, LINE 62 | After "previous" delete "foregoing" |
| COLUMN 5, LINE 13 | After "distributed" delete "Brogg reflects" insert --Bragg reflector-- |

Signed and Sealed this

Thirty-first Day of May, 1988

Attest:

DONALD J. QUIGG

Attesting Officer

Commissioner of Patents and Trademarks